United States Patent
Mourick et al.

Patent Number: 5,949,273
Date of Patent: Sep. 7, 1999

[54] SHORT CIRCUIT PROTECTION FOR PARALLEL CONNECTED DEVICES

[75] Inventors: Paul Mourick, Fuerth; Dejan Schreiber; Erik Anderlohr, both of Zirndorf, all of Germany

[73] Assignee: Semikron Elektronik GmbH, Germany

[21] Appl. No.: 08/890,638

[22] Filed: Jul. 14, 1997

[30] Foreign Application Priority Data

Jul. 12, 1996 [DE] Germany .......................... 196 28 131

[51] Int. Cl.$^6$ .................................................. H03K 17/72
[52] U.S. Cl. ........................ 327/442; 327/324; 327/434; 327/440
[58] Field of Search ..................... 327/403, 405, 327/432, 433, 473, 314, 325, 384, 440, 442, 110, 309, 313, 324; 307/126, 130; 361/56, 18, 78, 101, 63; 363/53, 85, 96, 132

[56] References Cited

U.S. PATENT DOCUMENTS 5,526,216  6/1996  Konrad et al. .......................... 361/101
5,534,810  7/1996  White ...................................... 327/308

Primary Examiner—Kenneth B. Wells
Assistant Examiner—Minh Nguyen
Attorney, Agent, or Firm—Morrison Law Firm

[57] ABSTRACT

A power semiconductor circuit provides a simple gate drive for switch components for the use in parallel-connected half-bridges, taking into consideration a gate voltage limitation to achieve short-circuit resistance. The circuit consists of drive circuits and main power circuits. The present invention contributes to solving the problems of the influence of the main power circuit on the drive circuit. According to the invention, switching transistors connected in parallel to the driver through separate activation and deactivation resistors, the former of relatively low resistance and the latter of relatively high resistance. Each of the switching transistors has an emitter resistor connected in parallel with a respective clamping diode to a sum point at ground, the cathode to the emitter. Each of the activation resistors is connected in series to the driver through a respective diode whose cathode is connected to the activation resistor. The gate of each switching transistor is connected to a supply voltage through a respective shunt diode with the cathode connected to the supply voltage to ensure that, due to the switching transistor's internal capacitive reactions, no gate voltage increase occurs that is higher than the supply voltage of the driver stage. The diodes are connected in series with the activation resistors prevent equalization between the gate ports via these resistors. Fast epitaxial diodes should be preferred in the gate circuit because of their low parasitic capacitances.

16 Claims, 5 Drawing Sheets

SHORT CIRCUIT PROTECTION FOR PARALLEL CONNECTED DEVICES

BACKGROUND OF THE INVENTION

The present invention relates to power circuits. Several such circuit arrangements are described in the literature. The increase in power density and the constantly expanding hybrid structure of power circuits requires far-reaching solutions to attenuate, reduce or even eliminate parasitic effects to increase the reliability of these circuits. Great efforts are underway to find improved circuit variants to improve short-circuit resistance.

DE 4,105,155 introduces the optimization of commutation circuits of a converter power circuit. In that invention, the switchable component of the commutation circuit is positioned close to the switching semiconductor component. This at least reduces parasitic inductivities. The minimizing of parasitic inductivities reduces the overcurrents in the switching process and thus allows a higher capacitance of the circuit.

DE 4,240,501 introduces a power semiconductor circuit whose positive and negative power inputs axe divided to reduce their inductivities. The findings from a certain symmetry of the circuit in the direct current branch are being further extended. The gain in power density in the circuits when the packing density is increased is more and more influenced by the drive in all circuit elements.

In the case of densely stacked primary power and drive connections, especially circuit breakers of high switching speed and high di/dt values (fast switches), the magnetic field of the main power supplies, which is built up by every individual power bus bar, influences each drive circuit in the immediate vicinity. In that case, reactions and mutual interference can occur, which is already mentioned in EP 0 427 143 B1, without the physical processes of the transformer coupling being described. Our own earlier application (P195 38 328.1-32) had as its objective to introduce a reactionless drive of power semiconductor components without transformer effect in power circuits by means of the magnetic decoupling of the drive circuit and the main power circuit. There, the problem is solved through exact specifications for the geometric layout of the electric lines in the drive circuit.

DE 4,410,978 A1 describes a process and an associated circuit for the improvement of the short-circuit resistance of a bipolar IGBT. In that invention the circuit is provided with a MOS transistor to reduce the voltage applied to the gate electrode of the IGBT during the short-circuit state which reduces the short circuit current, which flows through the IGBT. The Zener diodes, used in this switching arrangement to realize the gate dielectric strength, limit the voltage between the MOSFET and the gate electrode of the IGBT. From a study entitled "Further development and testing of a two stage drive circuit for IGBT" by P. Nagengast, University of Erlangen, Chair for Electric Drives, dated Nov. 12, 1992, such a short-circuit protected driver circuit is known, which works with a low number of components.

From DE 4,320,021 A1 and U.S. Pat. No. 4,719,531, two switching arrangements are known which describe VCE monitors of individual switches in circuits. With such switching arrangements a limited short-circuit protection can be achieved, but such short-circuit monitors are unsuitable for parallel-connected circuit-breakers. Because $V_{CE}$ monitors are temperature-dependent, the breaking-current overvoltage is not increased as desired.

During the 24th Colloquium for Semiconductor Power Components on Nov. 13, 1995 in Freiburg, S. Konrad introduced a "Protection concept for voltage-controlled power-semiconductors". Here, the gate-emitter voltage of an IGBT switch is limited to a certain path through the installation-of a MOSFET.

Referring to FIG. 1, a detail of a conventional circuit arrangement with an individual switch without limiting elements for the gate drive is shown. FIG. 1 also shows a customary half-bridge circuit with IGBTs $T_1$ and $T_2$ and their respective driver circuits. The end phases $T_3/T_4$ of the TOP driver and $T_5/T6$ of the BOTTOM driver are shown with associated output circuits. For clarification, the so-called Miller capacitances $C_1$ and $C_2$ are shown as external capacitances. It is well known that capacitances $C_1$ and $C_2$ (the Miller capacitances) are integrated in the structure of a conventional IGBT switch.

Either IGBT $T_1$ or $T_2$ is switched on when its respective gate is charged via top MOSFET $T_3$ or $T_5$ of its respective driver end phase with corresponding gate resistor $R_1$ or $R_2$ on +15V of the driver operating voltage source, while the serial-connected POSIT blocks $T_1$ or $T_2$.

Either IGBT $T_1$ or $T_2$ is switched off when its associated MOSFET $T_3$ or $T_5$ is blocked and its respective gate is discharged to −8V. Each respective gate discharges via its corresponding series-connected MOSFET ($T_4$ or $T_6$) and resistors ($R_1$ and $R_3$ or $R_2$ and $R_4$). As with all MOS-controlled switches, activation and deactivation is accomplished by charging and discharging the gate-emitter capacitance. Due to the voltage rise between the collector and emitter, the Miller capacitance ($C_1$ or $C_2$) of the IGBT ($T_1$ or $T_2$) must be re-charged as well.

If a short circuit occurs in the circuit of the lead IGBT, that IGBT represents the determining, current-limiting element in that circuit. The amplitude of the short-circuit current is determined by the finite amplification and the momentary gate-emitter voltage of the IGBT. The voltage rise $dU_{CE}/dt$ at the collector-emitter path of IGBT $T_1$ or $T_2$, which is very positive because of the rising short-circuit current, causes a recharging of Miller capacitance $C_1$ or $C_2$.

However, the recharging current pulses through the Miller capacitance ($C_1$ or $C_2$) increasing the gate-emitter voltage of the IGBT ($T_1$ or $T_2$), since its gate is decoupled by resistor $R_1$ or $R_2$ against driver end phase, so that the short-circuit current can rise further. This can lead to short-circuit current pulses whose amplitude may lie far above the +15V gate-emitter voltage prescribed by the driver voltage.

The less favorable the relationship between the gate-emitter capacitance and the Miller capacitance of the IGBT switch, the greater the danger of switch failure. The gate voltage of a conventional IGBT is limited by using conventional suppressor diodes. An example of limiting a gate voltage with a diode is shown in the previously discussed study entitled "Further development and testing of a two stage drive circuit for IGBT" (1993).

In this circuit, a disadvantage is the temperature dependence and the tolerance of the suppressor diodes. In the most recent generation of conventional IGBT switches, such a circuit arrangement is no longer able to provide sufficient short-circuit resistance.

FIG. 2 shows a detail of a conventional TOP driver, analogous to the TOP driver in FIG. 1, with three parallel connected power switches. As the circuit diagram indicates, the main emitters as well as the auxiliary emitters are parallel connected. If the auxiliary emitters are not parallel-connected and if only one auxiliary emitter connection is provided, oscillations may occur in the power switches. This is especially true in the case of a short-circuit. When a short circuit occurs the gate of each power switch is no longer associated with its own emitter via the drive circuit. The parallel-connection of the auxiliary emitters eliminates this association problem. However, circular (loop) currents are possible via the auxiliary emitter/main emitter circuit. Auxiliary emitter resistors (Re) are used to limit the amplitudes of these circular currents. The auxiliary emitter resistors have a preferred value of 0.5 Ohms. This means that the voltage reference for the drive circuit is the mean emitter voltage. However, the gate voltage can again be influenced through the circular currents via these resistors. This occurs in particular when there is an asymmetry in the current of the load modules.

The poor performance of the circuit shown in FIG. 2 will be investigated though a discussion of FIG. 2a and are addressed in the present invention as shown in FIG. 2b.

FIG. 2a shows the situation that occurs when two modules have already cut out the current during a commutation process and only one module still has power. The left part of FIG. 2a shows the three module currents during the turn-off process. The di/dt of current 1 becomes considerably smaller after currents 2 and 3 have already reached zero. As indicated in curves 2 and 3, the inductivities for the minus connection of the intermediate circuit are no longer effective for currents 2 and 3. This is a result of the currents 2 and 3 not being large. Since the currents are not large, they can be disregarded in the equivalent circuit diagram, but inductivity 1 is still effective.

This inductivity, which normally lies outside the gate drive circuit, now suddenly becomes effective, namely through the configuration of the auxiliary emitter resistors, in this example, with ⅔ of its value. The emitter degeneration of the slowest IGBT is once again amplified by this, and the IGBT switching transistor becomes even slower. In principle, these effects may occur with every module in a half-bridge with parallel connection.

A considerable reduction of the adverse effects is possible because the resistive voltage divider of the supplementary emitter resistors does not become effective during the cut-off phase. This can be achieved most easily through diodes parallel to the auxiliary emitter resistors. It must be taken into account that the voltage at the remaining inductivity on the side toward the interim circuit is positive during the cut-off phase. As shown in FIG. 2b, for the diode to be effective, its cathode must be connected with the emitter of the IGBT. This eliminates the strong effect of the inductivity outside the gate drive circuit. These diodes must be provided for each IGBT to ensure that all possible current asymmetries are covered by this measure. Preferably, the diodes used are Schottky diodes which have lower forward voltages.

FIG. 3 shows a comparable arrangement, according to the prior art, with a transistor insert. FIG. 3 represents a second possibility according to prior art that was already published in the above-named study in 1993. When a short circuit occurs, the gate-emitter voltage of $T_1$ exceeds the required value of the driver operating voltage of +15V plus the value of the base-emitter path of the pnp transistor $T_7$, the transistor $T_7$ controls and takes over the recharge pulse of the Miller capacitance. Thus, the gate-emitter voltage of $T_1$ is limited.

The solution in FIG. 3 can not be used in the case of parallel-connected IGBTs because the operating voltage, as a voltage reference, can be clearly assigned to the emitters of each individual IGBT but refers to the mean value of the emitter potentials. Another solution must be found for parallel connected IGBTs.

FIG. 4 shows a gate voltage limiting device according to the prior art, where a Schottky diode ($D_3$) is used with a half bridge circuit without parallel-connection. A limiting circuit is shown with only one additional component per IGBT switch. A fast diode $D_3$ bridges resistor $R_1$ in case of a short-circuit in the on-phase and leaks the recharge current pulse of the corresponding Miller capacitance to the driver supply voltage source via the antiparallel diode integrated in the $T_3$ MOSFET.

The effectiveness of this circuit is detrimentally affected by the parasitic inductiveness of the connection lines between the driver end phase and the gate and emitter ports of the IGBT. This is a disadvantage that does not occur in all design variants of circuit arrangements. The $D_3$ diodes and the diodes integrated in the $T_3$ transistor act as limiting diodes.

FIG. 5 shows a conventional gate-emitter voltage limiter by means of an additional Schottky diode $D_3$ and a capacitor $C_3$ in the immediate vicinity of the gate-emitter ports of IGBT $T_1$. Once again, the figure sketches a detail from a circuit of the driver end phase of the TOP driver.

The capacitor $C_3$ is charged via the resistor $R_5$ (with a typical value of about 10 Ohm) to the original +15 V of the driver. An adequate gate-emitter voltage limitation is achieved when capacitance $C_3$ is clearly greater than the gate-emitter capacitance of the IGBT in question. In the case of a short circuit, capacitor $C_3$ can absorb the recharge current pulse through the Miller capacitance, without much rise in the voltage.

FIG. 6 shows a conventional gate drive circuit for parallel-connected half-bridges analogous to FIG. 5. This circuit is less suitable for a parallel circuit because the emitter inductivities can cause interaction with the capacitors in the form of oscillations, especially true in the case of asymmetric current patterns.

FIG. 7 shows a variant of a conventional circuit arrangement, again showing the detail for a TOP driver, with a reference diode. By using a temperature-stabilized voltage reference diode $D_7$ in combination with a pnp transistor $T_7$, a solution can be achieved that is analogous to the prior art shown in FIG. 3. This circuit variant has a disadvantage in that the base-emitter path of the pnp transistor $T_7$,with the IGBT turned off, must block $T_1$ at about 8V. This problem can be minimized by reducing the negative supply voltage of the driver from –8V to –5V. This is not a practical limitation in most cases.

OBJECTS AND SUMMARY OF THE INVENTION

The objective of the present invention is to introduce a simple gate drive for switch components for the use in parallel-connected half-bridges, taking into consideration a gate voltage limitation to achieve short-circuit resistance.

Briefly, a power semiconductor circuit provides a simple gate drive for switch components for the use in parallel-connected half-bridges, taking into consideration a gate voltage limitation to achieve short-circuit resistance. The circuit consists of drive circuits and main power circuits. The present invention contributes to solving the problems of the influence of the main power circuit on the drive circuit. According to the invention, switching transistors connected in parallel to the driver through separate activation and deactivation resistors, the former of relatively low resistance and the latter of relatively high resistance. Each of the switching transistors has an emitter resistor connected in parallel with a respective clamping diode to a sum point at ground, the cathode to the emitter. Each of the activation resistors is connected in series to the driver through a respective diode whose cathode is connected to the activation resistor. The gate of each switching transistor is connected to a supply voltage through a respective shunt diode with the cathode connected to the supply voltage to ensure that, due to the switching transistor's internal capacitive reactions, no gate voltage increase occurs that is higher than the supply voltage of the driver stage. The diodes are connected in series with the activation resistors prevent equalization between the gate ports via these resistors. Fast epitaxial diodes should be preferred in the gate circuit because of their low parasitic capacitances.

A circuit arrangement consists of drive circuits and main power circuits. Both types of circuit are most densely packed at the switch positions (based on the example of IGBT or MOSFET). The spatial design of these tight points with high packing density is a determining factor for the performance of the entire circuit arrangement because it requires that the influence of the main power circuit on the drive circuit be minimized. The present invention contributes to solving the problems this causes. In modern high-performance switching transistors, the power consumption of the drive is only an extremely small fraction of the switching performance that must be accomplished in the associated main power circuit, and the switching frequencies as well as the switching speeds continue to increase in new designs.

According to an embodiment of the present invention, there is provided, a power semi-conductor circuit, comprising: a circuit with switching transistors connected in parallel to a driver, each of the switching transistors being connected in parallel to the driver through an activation resistor and a deactivation resistor, each of the switching transistors having a respective emitter resistor connected to an emitter thereof, the emitter resistors being connected in parallel to a sum point connected to ground, each of the activation resistors being connected in series to the driver through a respective first diode with a cathode of the diode connected to the activation resistor, each of the switching transistors having a respective gate connected to a supply voltage through a respective shunt diode whose cathode is connected to the supply voltage and the emitter of the each of the switching transistors being connected to a cathode of a respective clamping diode, the clamping diode being connected in parallel with the emitter resistor of the each of the switching transistors.

According to another embodiment of the present invention, there is provided, a circuit arrangement, comprising: a driver having activation and deactivation outputs, switching transistors, each with a gate connected to the activation output of the driver through a diode in series with an activation resistor, each of the gates also being connected to the deactivation output of the driver through a deactivation resistor, each of the switching transistors having an emitter connected in parallel to a sum point by an emitter resistor and a clamping diode and each of the gates being connected to a supply voltage by a respective shunt diode.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
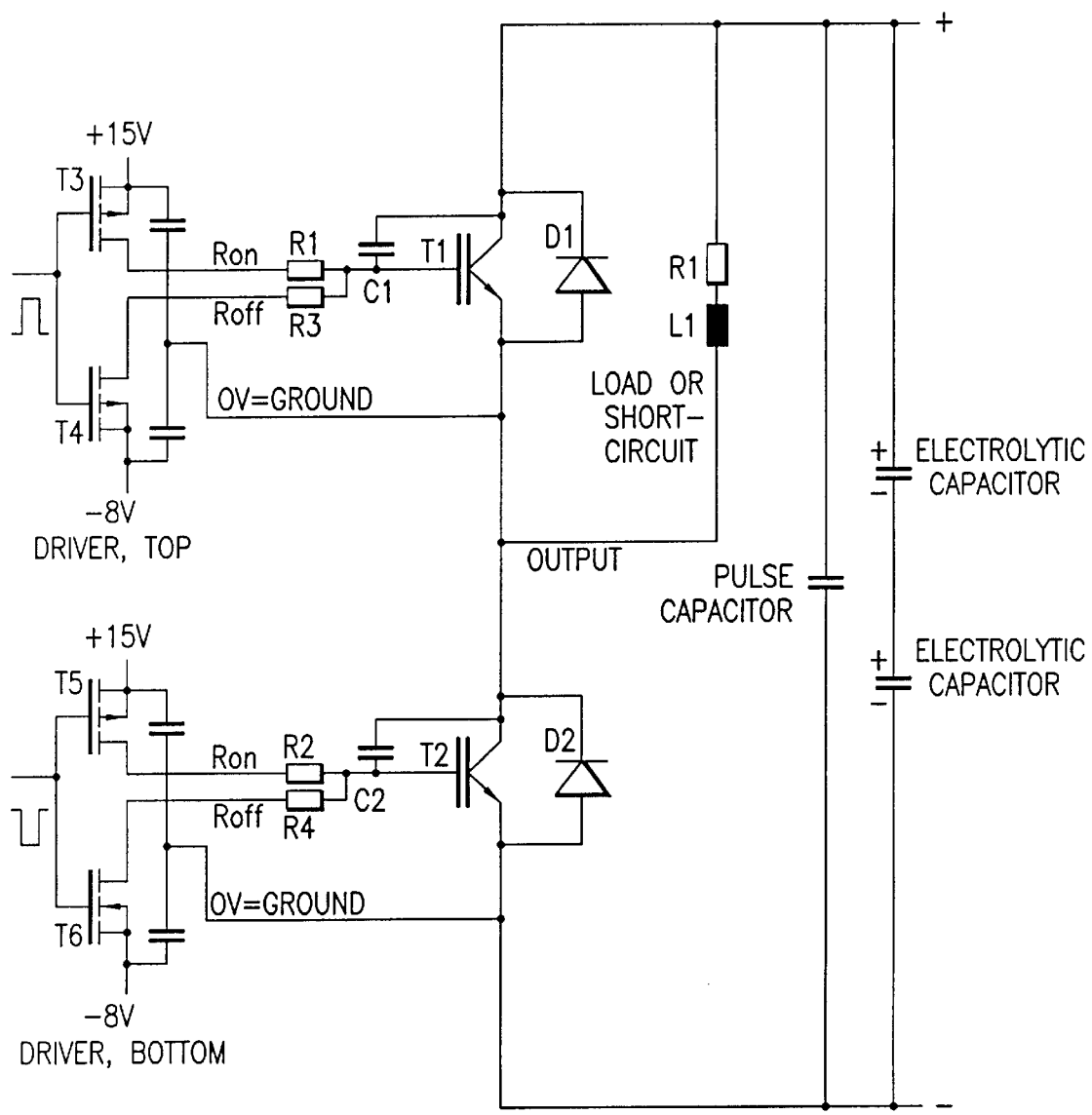
FIG. 1 shows detail from a circuit arrangement with an individual switch according to prior art, without limiting elements for the gate drive.
Figure 2:
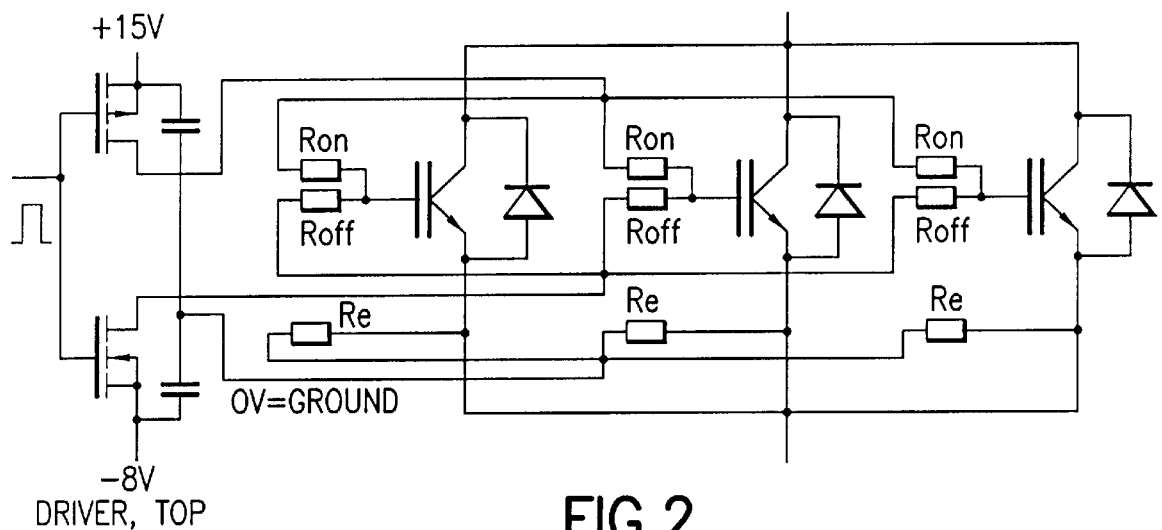
FIG. 2 shows detail of a conventional TOP drive circuit analogous to the TOP drive circuit of FIG. 1, in the case of three parallel-connected power switching devices.
Figure 2A:
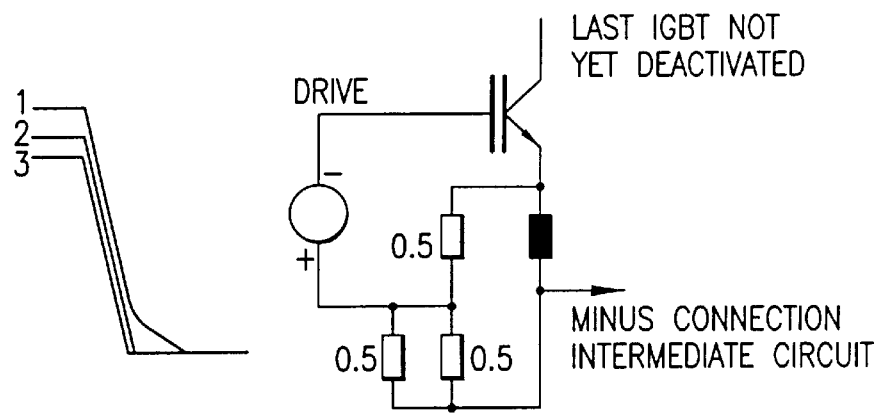
FIG. 2a shows a theoretical discussion of a hypothetical circuit's behavior of an asymmetrically driven half bridge circuit.
Figure 2B:
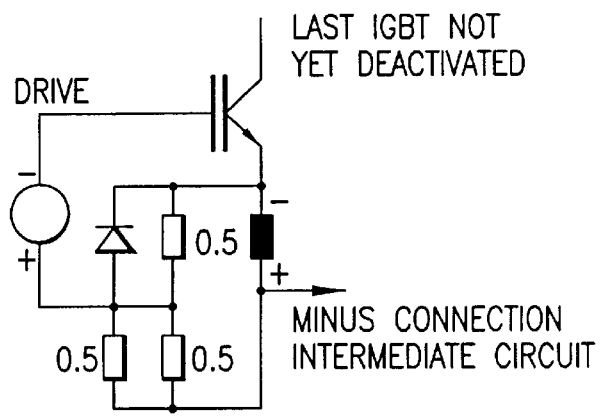
FIG. 2b shows an improved half bridge circuit according to an aspect of the present invention.
Figure 3:
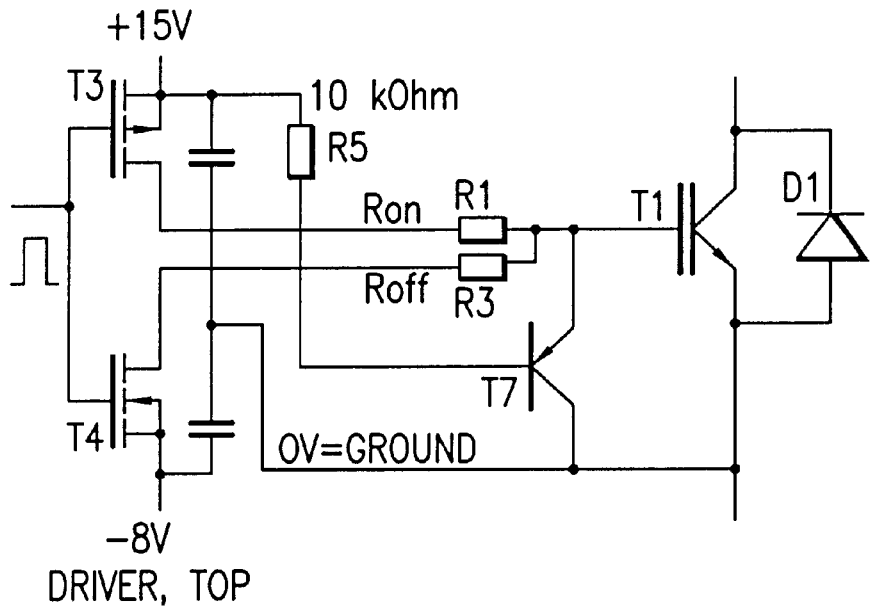
FIG. 3 shows a conventional TOP driver circuit, analogous to the TOP drive circuit of FIG. 2, with an additional transistor inserted.
Figure 4:
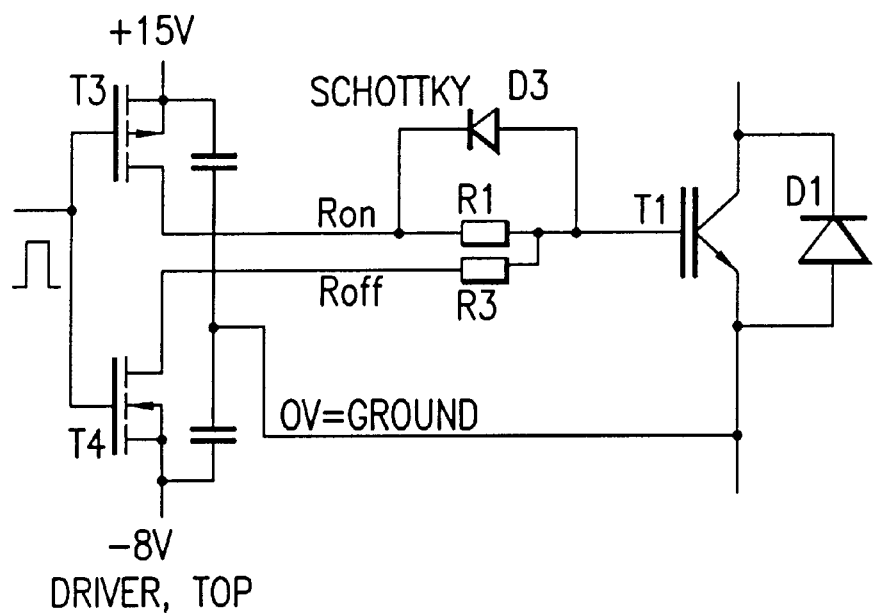
FIG. 4 shows a conventional gate voltage limiter using a Schottky diode for a half-bridge circuit without parallel connected switching devices.
Figure 5:
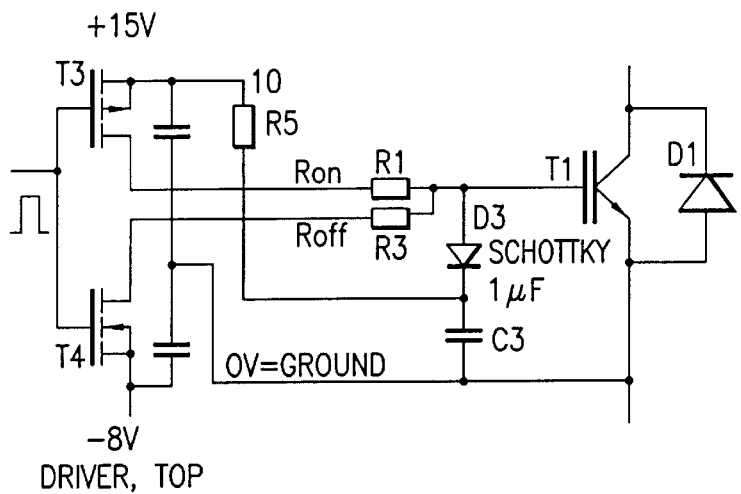
FIG. 5 shows a conventional TOP driver circuit with gate voltage limiting means using a Schottky diode and a capacitor.
Figure 6:
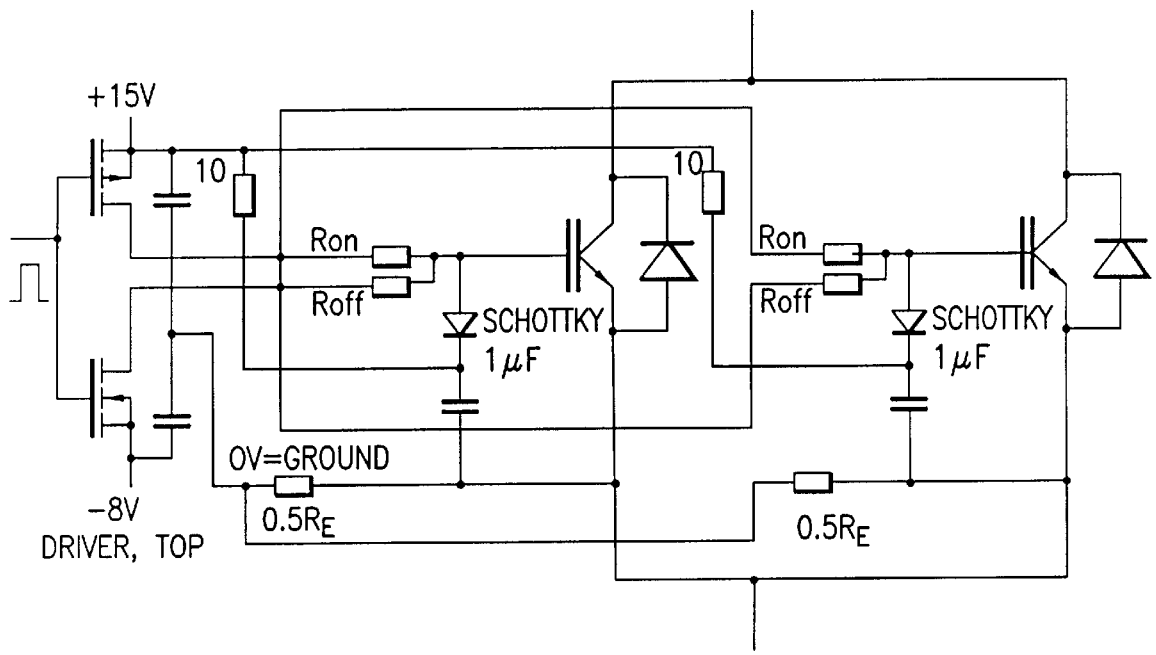
FIG. 6 shows a conventional gate drive circuit with gate voltage limiting means for parallel-connected half-bridge circuits analogous to FIG. 5.
Figure 7:
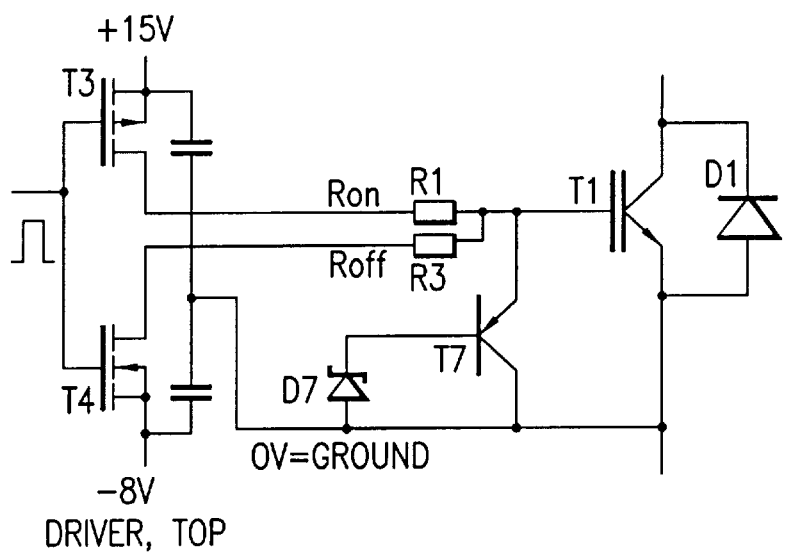
FIG. 7 shows a conventional TOP driver circuit with gate voltage limiting means using a reference diode and a transistor.
Figure 8:
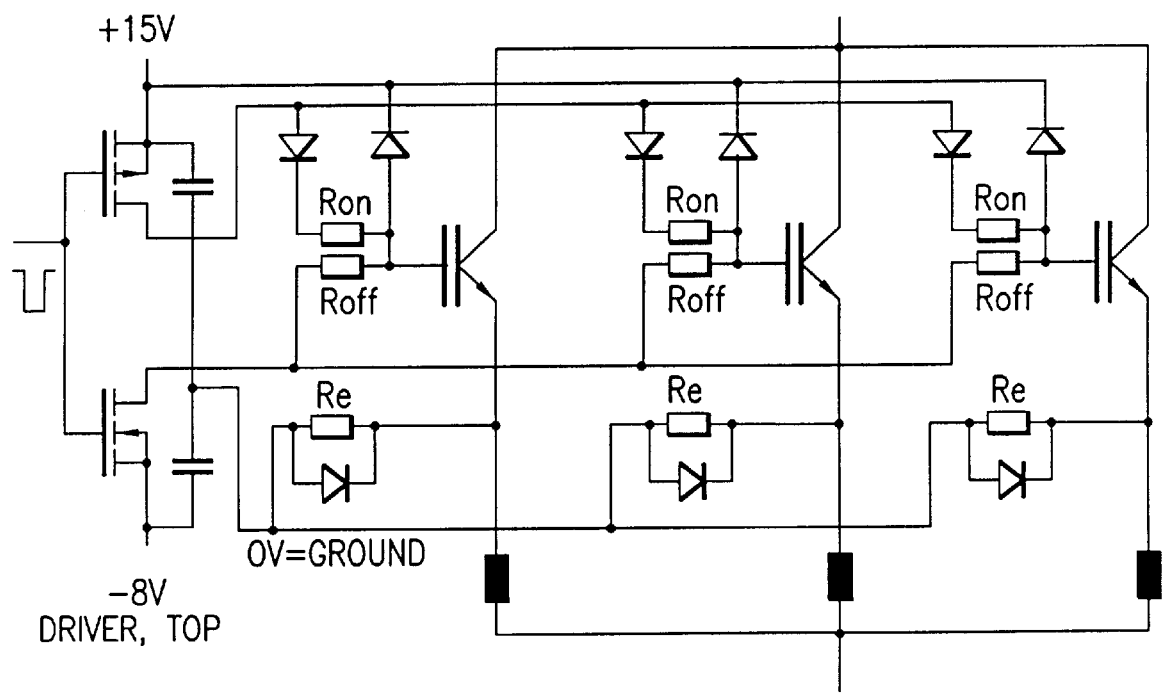
FIG. 8 shows a TOP driver circuit according to the present invention.

FIG. 8 shows a detail of the circuit analogous to that sketched in FIGS. 2 to 7, with auxiliary emitter resistors and Schottky diodes. This circuit arrangement according to the invention shows a solution to the problem that guarantees satisfactory operation with short-circuit protection for the given tolerances and temperature fluctuations, and that is very well suited for the parallel connection of several IGBT switches, in contrast to the circuit variants shown in FIGS. 3 to 5 and 7. Detailed measurements with parallel-connected modules under the most variable operating conditions have shown that as far as the drive is concerned, measures for the gate circuit as well as for the auxiliary emitter ports were necessary. These are all shown in FIG. 8. The reasons for the circuit configurations according to the invention, in the auxiliary emitter circuit, are stated in the description for FIGS. 2a and 2b.

If the current loops are uneven, always related to a DCB (direct copper bonding) ceramic or a module, the parasitic inductivities per DCB ceramic are also different. This causes currents of variable intensity, particularly in case of short-circuits. The DCB with the lowest inductivity has the highest short-circuit current. This also affects the emitter voltages, which means that emitter voltages differ. Without the Schottky diodes, the mean emitter voltage is used as reference for the driver. This can mean that the gate voltage for the DCB ceramic is either too high or too low.

The differences in gate voltage, which can be quite considerable, depend on the differences in emitter voltage. However, excessively high gate voltages should be avoided, since very high gate voltages allow high short-circuit currents. With lower gate voltages, short-circuit limitation occurs at lower values. The epitaxial diodes and Schottky diodes in FIG. 8 have the effect that in no module can the gate voltage increase beyond +15 V plus ca. 0.5 to 1 Volt as the sum of both diode thresholds.

Measurements with parallel-connected modules have shown that the gate potentials can influence each other considerably. Due to the parasitic emitter inductivities, especially in the case of uneven current division, irregularities occur in the emitter voltages. These have a feedback effect on the gate potential via the internal gate-emitter capacitances of the IGBT. This can lead to undesirable oscillations between the gate ports, particularly in the case of short-circuits. The resistors between gate ports must be of the highest possible impedance to ensure that equalization processes between these ports are largely reduced or eliminated. According to the invention, this is accomplished as follows:

1. Every IGBT module is provided with its own gate resistors.
2. The $R_{ON}$ gate resistors for activating the IGBT and the $R_{OFF}$ gate resistors for deactivating them are distinguished. In measurements it has been shown that the $R_{OFF}$ gate resistors for deactivating the IGBT can be dimensioned with a much higher impedance than the gate $R_{ON}$ resistors for activating the IGBT.
3. Diodes connected in series with the low-impedance $R_{ON}$ gate resistors for activating the IGBT prevent the equalization between the gate ports via these resistors. Fast epitaxial diodes should be preferred in the gate circuit because of their low parasitic capacitances.
4. In addition, each module is provided with shunt diodes against the supply voltage to ensure that due to IGBT-internal capacitive reactions no gate voltage increase occurs that is higher than the supply voltage of the driver stage. In case of a short-circuit, excessive gate voltage can lead to high short-circuit currents and thus to the destruction of the circuit arrangement.
5. No decoupling diodes are necessary in the case of $R_{ON}$ resistors of higher impedance connected in series.
6. During every switching phase, a defined voltage must be applied to the gate contacts.

The limiting circuit is extremely suitable in the case of several parallel-connected IGBTS such as shown in FIG. 8.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A power semi-conductor circuit comprising:
    a driver having an activation and deactivation output; and
    a plurality of parallel connected switching circuits, each said switching circuit having:
        a switching transistor having a gate, emitter and collector,
        said emitter being connected to emitters of all other said switching circuits,
        said collector being connected to collectors of all other said switching circuits,
        an activation resistor connected between said gate and a cathode of a first diode, said first diode having an anode connected to said activation output,
        a shunt diode having a cathode connected to a supply voltage and an anode connected to said gate,
        a deactivation resistor connected between said deactivation output and said gate, and
        an emitter resistor parallel connected to a clamping diode, said clamping diode having a cathode connected to said emitter and an anode connected to a sum point connected to ground;
    such that during a short circuit condition, said switching circuit prevents oscillations in voltages from appearing at each respective gate, and also prevent mismatches in voltages from appearing across said emitter resistors.

2. A circuit according to claim 1, wherein each said activation resistor is of a lower impedance than each said deactivation resistor.

3. A circuit according to claim 1, wherein each said first, clamping, and shunt diodes are fast epitaxial diodes.

4. A circuit according to claim 1, wherein each said clamping diode is a Schottky diode.

5. A circuit as in claim 1, wherein:
    each said first diode is a fast epitaxial diode; and
    each said clamping diode is a Schottky diode.

6. A circuit as in claim 1, wherein:
    each said first diode is a fast epitaxial diode;
    each said clamping diode is a Schottky diode; and
    each said activation resistor is of a lower impedance than each said deactivation resistor.

7. A circuit arrangement, comprising:
    a driver having activation and deactivation outputs;
    a plurality of switching transistors, each with a gate connected to said activation output of said driver through a respective diode in series with a respective activation resistor;
    each of said switching transistors having an emitter connected to emitters of all other said switching transistors,
    each of said switching transistors having a collector connected to collectors of all other said switching transistors,
    each of said gates also being connected to said deactivation output of said driver through a respective deactivation resistor;
    each of said switching transistors having an emitter connected to a sum point through a respective emitter resistor, each said respective emitter resistor being connected in parallel to a respective clamping diode;
    each of said gates being connected to a supply voltage through a respective shunt diode, whereby voltages appearing at each respective gate are limited during a short circuit condition.

8. A circuit as in claim 7, wherein each said deactivation resistor has a resistance that is greater than a resistance of each said activation resistor.

9. A circuit as in claim 7, wherein:
    said driver selectively connects said activation output to said supply voltage; and
    said driver selectively connects said deactivation output to ground.

10. A circuit as in claim 7, wherein said sum point is at ground.

11. A circuit as in claim 7, wherein each said clamping diode is a Schottky diode.

12. A circuit as in claim 7, wherein:
    each said deactivation resistor has a resistance that is greater than a resistance of each said activation resistor;
    said driver selectively connects said activation output to said supply voltage; and
    said driver selectively connects said deactivation output to ground.

13. A circuit as in claim 7, wherein:
    each said deactivation resistor has a resistance that is greater than a resistance of each said activation resistor;
    said driver selectively connects said activation output to said supply voltage;
    said driver selectively connects said deactivation output to ground; and sum point is at ground.

14. A circuit as in claim 7, wherein:

each said deactivation resistor has a resistance that is greater than a resistance of each said activation resistor;

said driver selectively connects said activation output to said supply voltage;

said driver selectively connects said deactivation output to ground; and each said clamping diode is a Schottky diode.

15. A circuit as in claim 7, wherein:

each said deactivation resistor has a resistance that is greater than a resistance of each said activation resistor;

said driver selectively connects said activation output to said supply voltage;

said driver selectively connects said deactivation output to ground;

each said clamping diode is a Schottky diode; and each said diode in series with said activation resistor is a fast epitaxial diode.

16. A power semi-conductor circuit comprising:

a driver having an activation and deactivation output;

a circuit with parallel connected switching circuits, each said switching circuit having:

a switching transistor having a gate, emitter and collector, said emitter being connected to an emitter common point, said collector being connected to a collector common point, an activation resistor being series connected between said gate and a cathode of a first diode, said first diode having an anode connected to said activation output, a shunt diode having a cathode connected to a supply voltage and an anode connected to said gate, a deactivation resistor being connected between said deactivation output and said gate, and an emitter resistor being parallel connected to a clamping diode, said clamping diode having a cathode connected to said emitter and an anode connected to a sum point connected to ground;

each said deactivation resistor has a resistance that is greater than a resistance of each said activation resistor, said driver selectively connects said activation output to said supply voltage;

said driver selectively connects said deactivation output to ground;

each said clamping diode is a Schottky diode; and each said diode in series with said activation resistor is a fast epitaxial diode.

* * * * *